United States Patent
Kim et al.

(10) Patent No.: US 7,498,233 B2
(45) Date of Patent: Mar. 3, 2009

(54) METHOD OF FORMING AN INSULATION LAYER STRUCTURE HAVING A CONCAVE SURFACE AND METHOD OF MANUFACTURING A MEMORY DEVICE USING THE SAME

(75) Inventors: Min Kim, Seoul (KR); Dae-Woong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 11/381,065

(22) Filed: May 1, 2006

(65) Prior Publication Data

US 2006/0246657 A1 Nov. 2, 2006

(30) Foreign Application Priority Data

May 2, 2005 (KR) ...................... 10-2005-0036652

(51) Int. Cl.
*H01L 21/76* (2006.01)
(52) U.S. Cl. ...................... 438/437; 438/257; 438/294; 438/295; 438/296; 438/359; 438/404; 438/424; 438/435; 257/E21.546
(58) Field of Classification Search ................. 438/424, 438/435–437, 257, 294–296, 242, 268–274, 438/218, 219, 221, 248, 359, 404; 257/E21.546–E21.55
See application file for complete search history.

(56) References Cited

U.S. PATENT DOCUMENTS

| 6,465,293 | B2 | 10/2002 | Park et al. | |
|---|---|---|---|---|
| 6,576,530 | B1 * | 6/2003 | Chen et al. | 438/435 |
| 6,727,159 | B2 * | 4/2004 | Chen et al. | 438/435 |
| 7,163,869 | B2 * | 1/2007 | Kim et al. | 438/424 |
| 7,208,812 | B2 * | 4/2007 | Ohta | 257/510 |
| 7,332,408 | B2 * | 2/2008 | Violette | 438/435 |
| 2002/0053715 | A1 * | 5/2002 | Kim et al. | 257/524 |

(Continued)

FOREIGN PATENT DOCUMENTS

KR 20050020238 A * 3/2005

(Continued)

OTHER PUBLICATIONS

English language abstract of Korean Publication No. 2005-0002088.

(Continued)

*Primary Examiner*—Zandra Smith
*Assistant Examiner*—Joseph C Nicely
(74) *Attorney, Agent, or Firm*—Marger Johnson & McCollom, P.C.

(57) ABSTRACT

A method of forming an isolation layer structure for a semiconductor device includes forming a first structure on a substrate, the first structure including an insulation layer pattern having a sacrificial pattern therein, the sacrificial pattern having an etching rate that is different from the insulation layer pattern, partially removing the insulation layer pattern until the sacrificial pattern is exposed to form a second structure, partially removing the sacrificial pattern from the insulation layer pattern to form a third structure having a recessed portion at a central portion thereof, and removing an upper portion of the third structure such that a top surface of the third structure is concave with respect to a top surface of the substrate.

25 Claims, 9 Drawing Sheets

U.S. PATENT DOCUMENTS

| | | | |
|---|---|---|---|
| 2002/0142542 A1* | 10/2002 | Jeng | 438/257 |
| 2002/0142564 A1* | 10/2002 | Kumamoto | 438/435 |
| 2003/0124800 A1* | 7/2003 | Park et al. | 438/257 |
| 2003/0143854 A1* | 7/2003 | Chen et al. | 438/700 |
| 2005/0101089 A1* | 5/2005 | Kim et al. | 438/257 |
| 2005/0106820 A1* | 5/2005 | Tran | 438/270 |
| 2005/0266647 A1* | 12/2005 | Kim et al. | 438/296 |
| 2006/0094203 A1* | 5/2006 | Choi et al. | 438/424 |

FOREIGN PATENT DOCUMENTS

KR     1020050020238 A  *  3/2005

OTHER PUBLICATIONS

English language abstract of Korean Publication No. 2004-0051302.
English language abstract of Korean Publication No. 2004-0053440.

* cited by examiner

METHOD OF FORMING AN INSULATION LAYER STRUCTURE HAVING A CONCAVE SURFACE AND METHOD OF MANUFACTURING A MEMORY DEVICE USING THE SAME

CROSS-REFERENCE TO RELATED APPLICATIONS

This application claims priority under 35 USC § 119 to Korean Patent Application No. 10-2005-36652, filed on 2 May 2005. Korean Patent Application No. 10-2005-36652 is incorporated by reference in its entirety.

BACKGROUND

1. Technical Field

This disclosure relates to a method of forming an insulation layer structure and a method of manufacturing a semiconductor device using the same and more particularly, to a method of forming an insulation layer structure having a recess portion at an upper central portion and a method of manufacturing a semiconductor device including an insulation layer structure having a recess portion at an upper central portion.

2. Description of the Related Art

Generally speaking, semiconductor memory devices may be classified either as volatile memory devices, such as random-access memory (RAM) devices, or non-volatile memory devices, such as read-only memory (ROM) devices. Volatile semiconductor memory devices have relatively high operation speeds for inputting data and outputting data, but may lose stored data as time elapses. Non-volatile semiconductor memory devices have relatively low operation speeds for inputting data and outputting data, but are capable of permanently storing data.

Presently, among non-volatile memory devices, electrically erasable programmable ROM (EEPROM) devices or flash memory devices have been much in demand. The flash memory device has a structure that electrically controls the input and output of data using a Fowler-Nordheim (F-N) tunneling mechanism or a channel hot electron injection mechanism.

In order to increase an integration degree of the semiconductor device, a critical dimension (CD) of a floating gate of the flash memory device has been significantly reduced, resulting in an increase in failures of the semiconductor device caused by increased misalignment defects or a decreased coupling ratio.

To reduce misalignment defects, a conductive layer may be self-aligned relative to an isolation layer pattern to form a floating gate by a self-aligned shallow trench isolation (SA-STI) process or a self-aligned polysilicon STI (SAP-STI) process. Furthermore, the floating gate may have an enlarged contact area to make contact with a dielectric layer formed on the floating gate, thereby augmenting the coupling ratio.

An example method of manufacturing the flash memory device by the SAP-STI process is disclosed in U.S. Pat. No. 6,465,293. According to this conventional SAP-STI process, only an upper face of the floating gate is exposed. The side faces of the floating gate are not exposed because the isolation layer is formed between the neighboring floating gates adjacent to each other. Thus, in order to increase an effective area of the dielectric layer, the isolation layer should be etched further away to partially expose the side surface of the floating gate.

However, when a small quantity of the isolation layer is removed, an exposure area of the side surface of the floating gate is negligible, so that the coupling ratio of the semiconductor device is not sufficiently improved. In contrast, when the isolation layer is excessively etched to thereby expose most of the side surface of the floating gate, a tunnel oxide layer beneath the floating gate may be removed from the substrate or significant damage may be caused to the tunnel oxide layer.

Therefore, although various techniques for improving the coupling ratio have been proposed, such as changes to the structures of the floating gate and the isolation layer, there is still a requirement for a method of improving the coupling ratio of a semiconductor device without damaging the tunnel oxide layer.

Embodiments of the invention address these and other disadvantages of the conventional art.

SUMMARY

Example embodiments of the present invention provide a method of forming an insulation layer structure having an improved coupling ratio.

Example embodiments of the present invention provide a method of manufacturing a semiconductor device including an insulation layer structure having the improved coupling ratio.

BRIEF DESCRIPTION OF THE DRAWINGS

The above and other features and advantages of the invention will become more apparent by describing in detailed example embodiments thereof with reference to the accompanying drawings.

DETAILED DESCRIPTION

Figure 1:
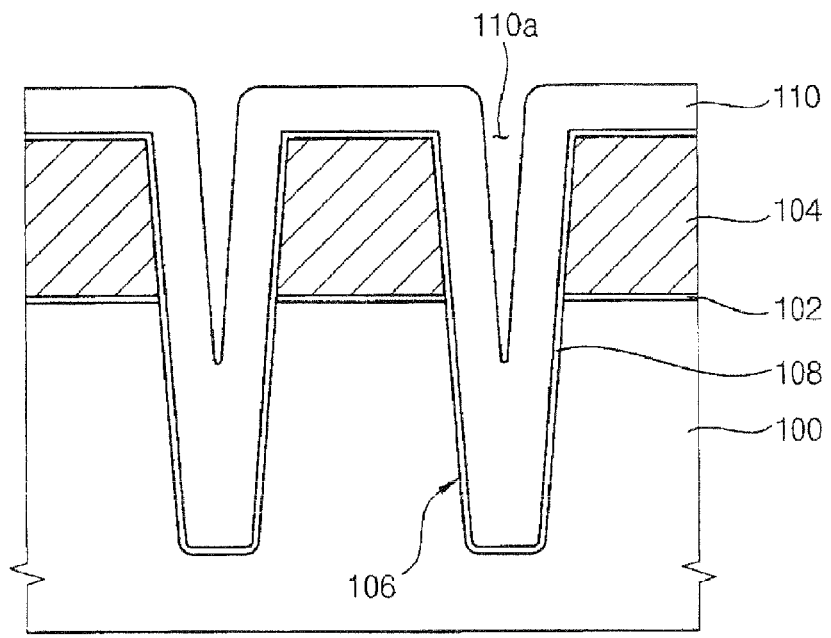
FIGS. 1 to 11 are cross sectional diagrams illustrating a method of manufacturing a semiconductor device in accordance with some embodiments of the invention.

The invention is described more fully hereinafter with reference to the accompanying drawings, in which embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross sectional diagrams that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region that is illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 11 are cross sectional diagrams that illustrate a method of manufacturing a non-volatile semiconductor device in accordance with some embodiments of the invention.

Referring to FIG. 1, a first buffer layer (not shown) and a hard mask layer (not shown) are sequentially formed on a substrate 100. The first buffer layer may be formed on the substrate 100 to decrease a stress, which may occur to the substrate 100 in a process for forming the hard mask layer. The hard mask layer may be formed using a nitride such as silicon nitride, silicon oxynitride, etc., when the first buffer layer is formed using oxide.

The hard mask layer and the first buffer layer are partially etched by a photolithographic process to thereby form a hard mask 104 and a first buffer layer pattern 102 on the substrate 100. The hard mask 104 may define a region in which a floating gate electrode is subsequently formed, so that the hard mask 104 may advantageously have a thickness that is substantially thicker than that of the floating gate electrode.

The substrate 100 is partially etched using the hard mask 104 as an etching mask to form a trench 106 at an upper portion of the substrate 100. An insulation layer for electrically isolating conductive structures formed on the substrate (hereinafter, referred to as isolation layer) is formed in a region defined by the trench 106 in a subsequent process. In an example embodiment of the invention, the trench 106 includes a gap between the hard masks that are adjacent to each other as well as a recess in the substrate 100 formed by the etching process.

A second buffer layer 108 is formed on an inner wall of the trench 106, so that damage, which may occur to the substrate 100 caused by collisions of ions having a relatively high energy in the etching process for forming the trench 106, may be cured and a current leakage may be prevented.

According to some embodiments, the second buffer layer 108 may have a stacked structure including a thermal oxide layer and a middle temperature oxide (MTO) layer. In particular, when the substrate 100 includes silicon, silicon at an exposed portion of the substrate 100 may be thermally oxidized to form a thermal oxide layer on the inner wall of the trench 106. The thermal oxide layer may have a thickness of about 10 to about 50 Å. The MTO layer may be formed on the thermal oxide layer by a chemical vapor deposition (CVD) process. The MTO layer may have a thickness of about 40 to about 190 Å. Thus, the second buffer layer 180 is formed on the inner wall of the trench 106.

A first insulation layer 110 is formed on the second buffer layer 108 to partially fill up the trench 106. The first insulation layer 110 may be formed by depositing silicon oxide by a CVD process. The first insulation layer 110 may include a silicon oxide such as undoped silicate glass (USG) or borophosphosilicate glass (BPSG), which has a good gap-fill characteristic. Thus, the first insulation layer 110 may fill up the trench 106 without voids or seams.

The first insulation layer 110 is continuously formed on the second buffer layer 108 to conform to a shape of the trench 106, so that the trench 106 is partially filled with the first insulation layer 110, and the first insulation layer 110 includes a gap 110a corresponding to the trench 106.

When the first insulation layer 110 is formed to an excessively small thickness, it is difficult for an isolation layer structure (see FIG. 10) to take a concave shape with respect to a top surface of the substrate 100 in a subsequent process. Additionally, the first insulation layer 110 may be easily removed from the second buffer layer 108 in a subsequent process due to the small thickness thereof, so that a first dielectric layer pattern 126 (see FIG. 10), which is a tunneling insulation layer of the non-volatile semiconductor device, may not be sufficiently protected by the first insulation layer 110.

Therefore, the first insulation layer 110 is preferably formed to a thickness of no less than about one fifth (⅕) of the gap between neighboring active regions that are adjacent to each other such that the trench 106 is not completely filled with the first insulation layer 110. The active region is a portion of the substrate surrounded by the isolation layer in the trench 106 and a plurality of conductive structures is formed in the active region, so that two neighboring active regions are spaced apart from each other by the trench 106 and the conductive structures are electrically isolated from each other by the isolation layer that fills up the trench 106 in a subsequent process.

According to some embodiments, the second buffer layer 108 is firstly formed on the inner wall of the trench 106 and the first insulation layer 110 is additionally formed on the second buffer layer 108, as shown in FIG. 1. According to other embodiments, either of the first insulation layer 110 and the second buffer layer 108 may be omitted. For example, when the MTO layer of the second buffer layer 108 is formed to a thickness more than about 190 Å, the second buffer layer 108 is used in place of the first insulation layer 110. As a result, the first insulation layer 110 does not need to be additionally formed on the second buffer layer 108. In still another example embodiment of the present invention, the first insulation layer 110 is formed on the inner wall of the trench 106 without the second buffer layer 108.

Figure 2:
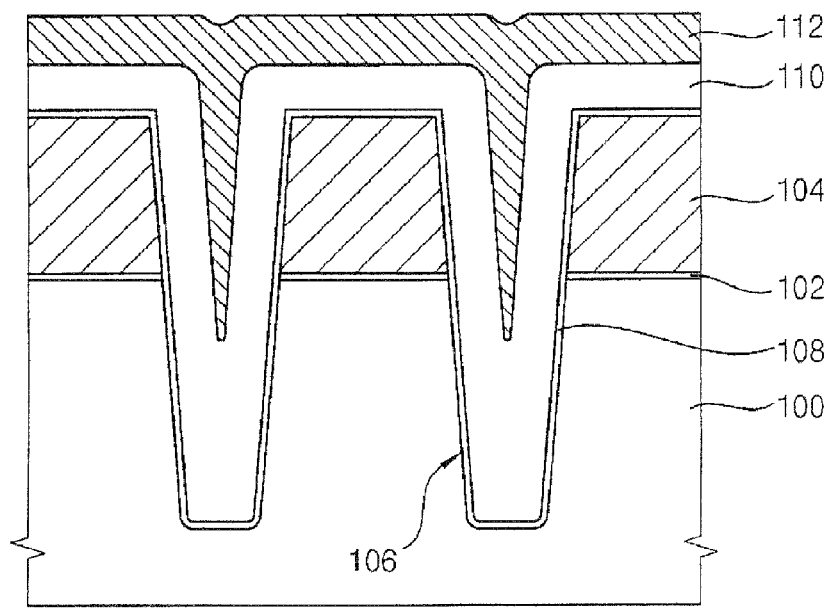

Referring to FIG. 2, a sacrificial layer 112 is formed on the first insulation layer 110 to a sufficient thickness to fill up the gap 110a. The sacrificial layer 112 may have an etching selectivity ratio with respect to the first insulation layer 110, so that only the sacrificial layer 112 is etched away while the first insulation layer 110 remains on the second buffer layer 108 in a succeeding process.

The etching selectivity ratio between the insulation layer 110 and the sacrificial layer 112 is preferably greater than about 1:10. For example, when the first insulation layer 110 includes silicon oxide, the sacrificial layer 112 may include silicon nitride, boron nitride and silicon germanium. According to some embodiments, the sacrificial layer 112 includes silicon nitride that is very suitable to a deposition process among the above materials and has an etching rate that is substantially higher than that of the first insulation layer 110 that includes silicon oxide.

Figure 3:
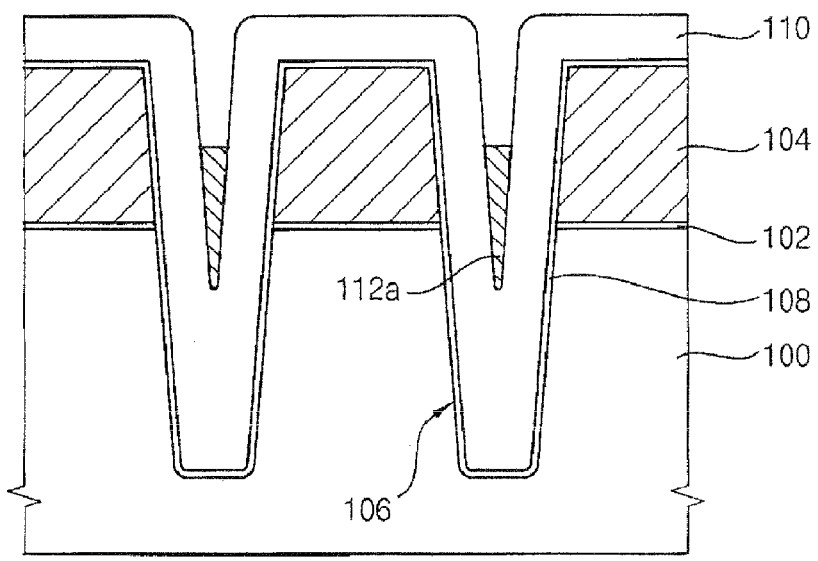

Referring to FIG. 3, the sacrificial layer 112 is partially etched away from the first insulation layer 110 to thereby form a sacrificial pattern 112a at a bottom portion of the gap 110a of the first insulation layer 110.

When a top surface of the sacrificial pattern 112a is lower than a bottom surface of the hard mask 104, forming a top surface of the isolation layer structure to have a concave shape with respect to a top surface of the substrate 100 in a subsequent process may be difficult. On the contrary, when the top surface of the sacrificial pattern 112a is higher than a top surface of the hard mask 104, the sacrificial pattern 112a is polished away in a subsequent polishing process, such as a chemical mechanical polishing (CMP) process, for exposing a top surface of the hard mask 104, so that the top surface of the sacrificial pattern 112a has the same level as the top surface of the hard mask 104. That is, the top surface of the sacrificial pattern 112a is exposed in the above polishing process as well as the top surface of the hard mask 104, thereby causing various defects in subsequent processes. For the above reasons, the top surface of the sacrificial pattern 112a is positioned between the top and bottom surfaces of the hard mask 104.

Practically speaking, there is a high likelihood that an upper portion of the hard mask 104 is removed from the substrate 100 in a subsequent polishing process, so that the top surface of the sacrificial pattern 112a may be positioned in a range substantially lower than three-fourths of a height of the hard mask 104. As a result, there is little chance that the top surface of the sacrificial pattern 112a is exposed even though the upper portion of the hard mask 104 is excessively removed from the substrate 100 in the polishing process. Furthermore, the top surface of the sacrificial pattern 112a may be positioned in a range that is substantially higher than one fourth (¼) of the height of the hard mask 104. When the top surface of the sacrificial pattern 112a is positioned lower than about one fourth (¼) of the height of the hard mask 104, forming the top surface of the isolation layer structure having a concave shape with respect to a top surface of the substrate 100 in a subsequent process may be difficult.

Either one of a wet etching process and a dry etching process may be performed when etching the sacrificial layer 112. According to some embodiments, the sacrificial layer 112 is partially removed by the wet etching process, so that the sacrificial pattern 112a is prevented from being damaged, which may otherwise occur in the sacrificial layer 112a in the dry etching process using a plasma.

Figure 4:
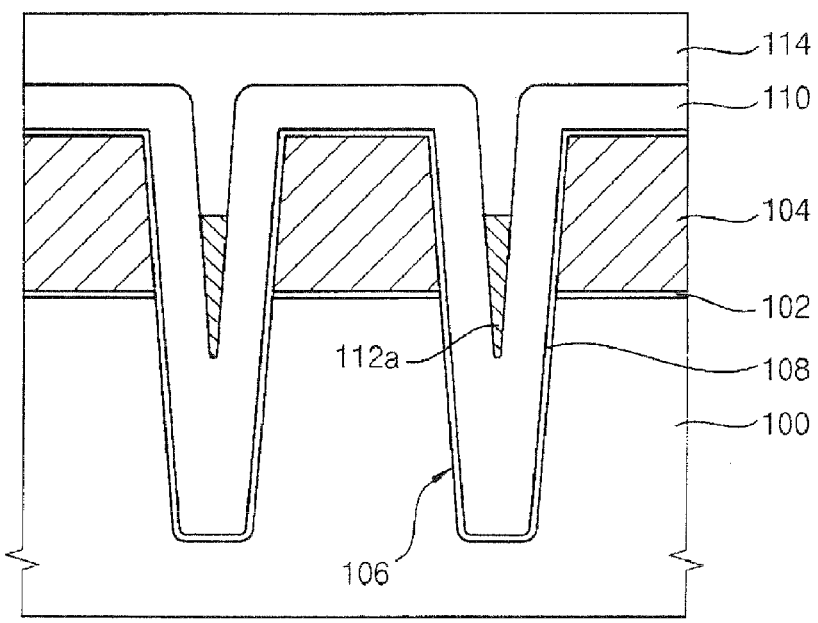

Referring to FIG. 4, a second insulation layer 114 is formed on the first insulation layer 110 to a sufficient thickness to fill up a vacancy of the gap 110a of the first insulation layer 110, so that the trench 106 is completely filled with the second buffer layer 108, the first insulation layer 110, the sacrificial pattern 112a and the second insulation layer 114.

The second insulation layer 114 may include a silicon oxide. According to some embodiments, the second insulation layer 114 is formed using USG or BPSG, which has a good gap-fill characteristic. According to some embodiments, the second insulation layer 114 includes an oxide layer formed by a high-density plasma chemical vapor deposition (HDP-CVD) process that is characterized as a good insulating characteristic and a dense layer structure.

Figure 5:
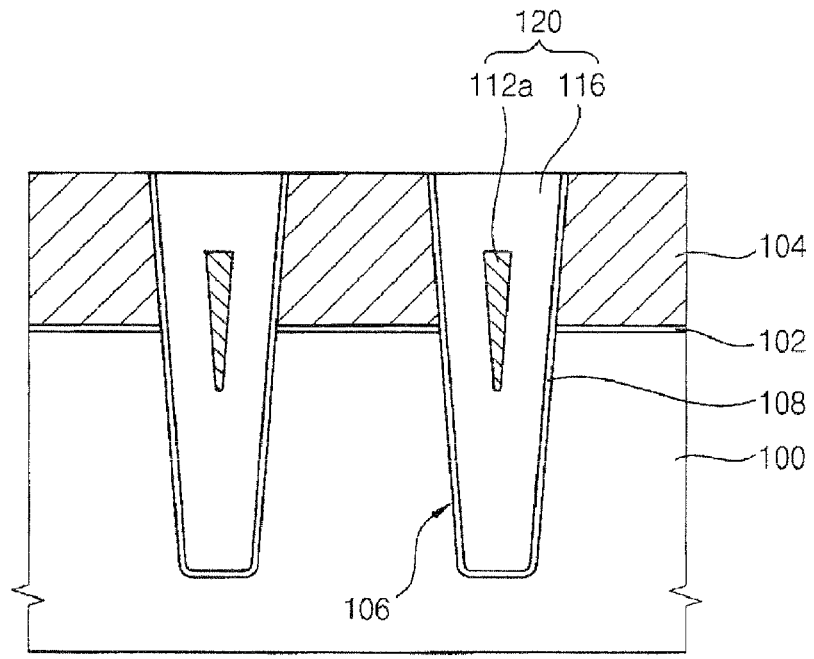

Referring to FIG. 5, the second insulation layer 114 and the first insulation layer 110 are polished by a polishing process, such as a CMP process, until the top surface of the hard mask 104 is exposed, so that the second buffer layer 108 and the first and second insulation layers 110 and 114 only remain in the trench 106. Thus, an insulation layer pattern 116 including the remaining first and second insulation layers 110 and 114 is formed in the trench 106.

Since the sacrificial pattern 112a is positioned lower than the top surface of the hard mask 104, the top surface of the sacrificial pattern 112a is not exposed despite the polishing process that polishes away the second insulation layer 114 and the first insulation layer 104. As a result, the sacrificial pattern 112a, which has an etching rate that is different from that of the insulation layer pattern 116, is formed in the insulation layer pattern 116. Hereinafter, a structure including the insulation layer pattern 116 and the sacrificial pattern 112a in the trench 106 is referred to as a first preliminary isolation layer structure 120.

Figure 6:
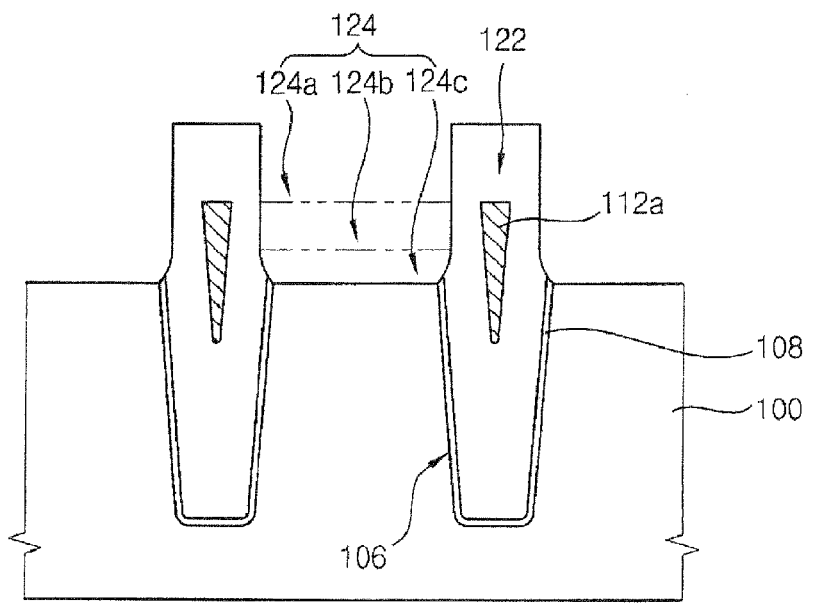

Referring to FIG. 6, the hard mask 104 and the first buffer layer pattern 102 are removed from the substrate 100, thereby forming an opening 124 that is defined by the first preliminary isolation layer structure 120, and through which the substrate 100 is partially exposed.

Since the sacrificial pattern 112a is positioned in the insulation layer pattern 116, the sacrificial pattern 112a is prevented from being removed in the process for removing the hard mask 104 and the first buffer layer pattern 102.

According to some embodiments of the invention, a sidewall of the insulation layer pattern 116 is partially etched in the process for removing the hard mask 104 and the first buffer layer pattern 102, so that a diameter of a lower portion of the opening 124 is smaller than that of an upper portion of the opening 124. Therefore, when a first dielectric layer pattern and a first conductive layer pattern are formed in the opening 124 in a succeeding process, the first dielectric layer pattern and the first conductive layer pattern are formed in the opening 124 that is free of voids or seams.

An exemplary process for forming the opening 124 that has a lower diameter that is substantially smaller than an upper diameter is described in detail below.

The upper portion of the hard mask 104 is partially etched on a condition that an etching selectivity ratio of the hard mask 104 with respect to the insulation layer pattern 116 is in a range of about 2:1 to about 5:1 to thereby form a first sub-opening 124a. While the upper portion of the hard mask 104 is partially etched away from the substrate 100, a sidewall of the insulation layer pattern 116 is also partially etched in accordance with the above etching selectivity ratio, so that the first sub-opening 124a has a first diameter that is substantially larger than a width of the hard mask 104.

A lower portion of the hard mask 104 is partially etched on a condition that an etching selectivity ratio of the hard mask 104 with respect to the insulation layer pattern 116 is in a range of over about 5:1 to thereby form a second sub-opening 124b which is connected with the first sub-opening 124a and has a second diameter. When the etching selectivity ratio of the hard mask 116 with respect to the insulation layer pattern 116 is no less than about 5:1 as described above, an etching amount of the insulation layer pattern 116 is negligible while the lower portion of the hard mask 104 is completely removed from the substrate 100.

Accordingly, the second diameter of the second sub-opening 124b is very similar to the first diameter of the first sub-opening 124a.

The first buffer layer pattern 102 exposed through the first and second sub-openings 124a and 124b is etched away from the substrate 100 to thereby form a third sub-opening 124c having a third diameter and through which the substrate 100 is exposed. The first buffer layer pattern 102 may be etched by a wet etching process so that damage to the substrate 100 is minimized in the etching process for removing the first buffer layer pattern 102.

When the first buffer layer pattern 102 is removed from the substrate 100, the sidewall of the insulation layer pattern 116 is also partially removed from the substrate 100. The first buffer layer pattern 102 is formed by a thermal oxidation process while the insulation layer pattern 116 is formed by a CVD process, so that the first buffer layer pattern 102 has a structure much denser than that of the insulation layer pattern 116. Accordingly, the first buffer layer pattern 102 may have an etching rate lower than that of the insulation layer pattern 116 in the same wet etching process. Accordingly, an inclination of the sidewall of the insulation layer pattern 116 in the third sub-opening 124c is smaller than that of the sidewall of the insulation layer pattern 116 in the first and second sub-openings 124a and 124b, so that the third diameter of the third sub-opening 124c is smaller than the first and second diameters of the first and second sub-openings 124a and 124b. Hereinafter, the first preliminary isolation layer structure 120 in which the sidewall of the insulation layer pattern 116 is partially removed from the substrate 100 is referred to as a second preliminary isolation layer structure and is designated as reference numeral 122 in FIG. 6.

Figure 7:
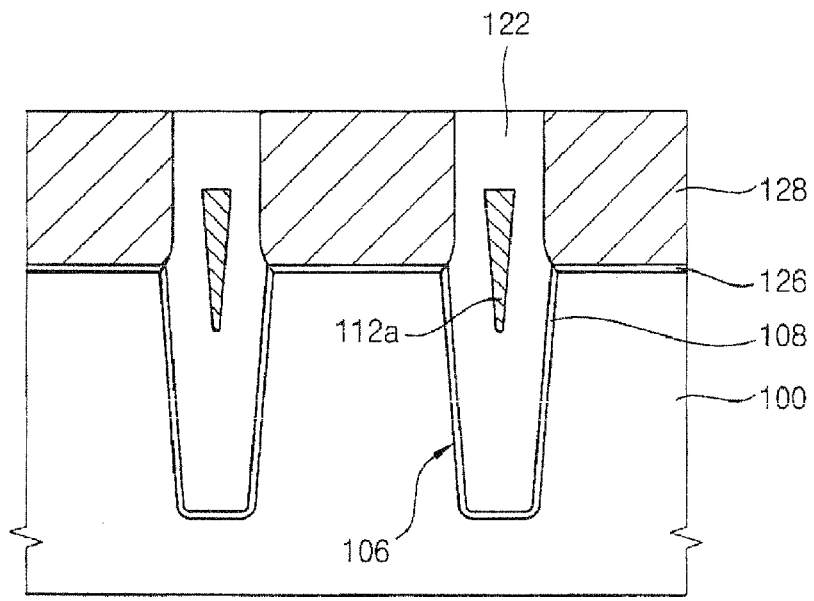

Referring to FIG. 7, a first dielectric layer pattern 126 is formed on a portion of the substrate 100 exposed through the opening 124. According to some embodiments, the first dielectric layer pattern 126 includes a silicon oxide layer that is formed by a thermal oxidation process. According to other embodiments, the first dielectric layer pattern 126 includes a silicon oxide layer doped with fluorine, a silicon oxide layer doped with carbon, or a low-k dielectric layer.

A first conductive layer (not shown) is formed on the first dielectric layer pattern 126 to a sufficient thickness to fill up the opening 124. The first conductive layer may include a doped polysilicon layer. The doped polysilicon layer may be formed by depositing doped polysilicon onto the first dielectric layer. In particular, a polysilicon layer may be initially formed on the first dielectric layer pattern 126 by a low-pressure CVD (LP-CVD) process and then impurities may be doped into the polysilicon layer by various doping processes, such as a diffusion process, an ion implantation process, and an in situ doping process.

The first conductive layer is polished and partially removed by a polishing process until a top surface of the second preliminary isolation layer structure 122 is exposed, so that the conductive layer only remains in the opening 124 to thereby form a first conductive layer pattern 128 in the opening 124. The first conductive layer pattern 128 may work as a floating gate of the non-volatile semiconductor device.

As described above, the opening 124 has the lower diameter smaller than the upper diameter, so that the first conductive layer pattern 128 in the opening 124 has a lower width smaller than an upper width thereof. Thus, the first conductive layer pattern 128 in the opening 124 has a lower portion as if the lower portion thereof was undercut as shown in FIG. 7.

Although not shown in the figures, a photoresist pattern is formed on the substrate 100 to mask a region for an unrecessed isolation layer. When the substrate 100 is divided into a cell region in which a plurality of unit cells is formed and a peripheral region in which a plurality of electrical circuits for driving the unit cells is formed, a recessed isolation layer is generally formed in the cell region and the non-recessed isolation layer is formed in the peripheral region. Therefore, when the recessed isolation layer is formed in the cell region, the photoresist pattern selectively exposes the cell region and masks the peripheral region.

Figure 8:
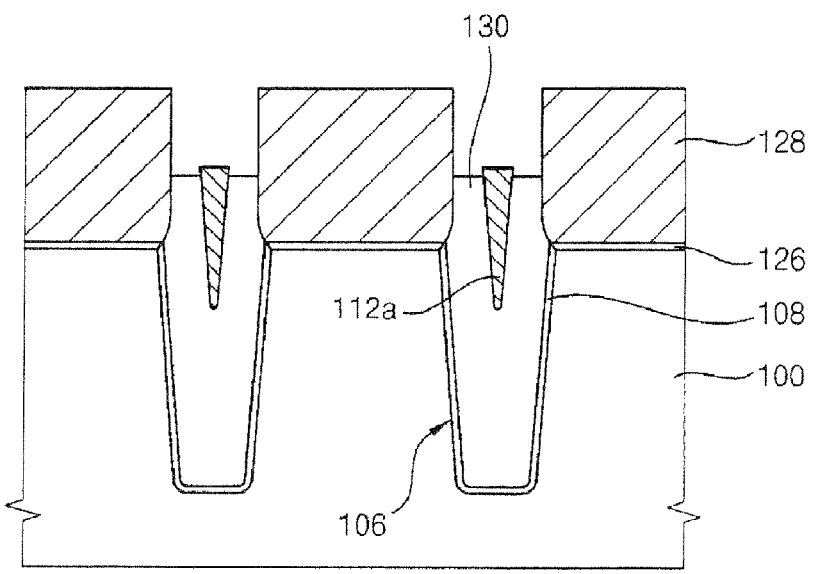

Referring to FIG. 8, an upper portion of the second preliminary isolation layer structure 122 is etched away from the substrate 100 until the top surface of the sacrificial pattern 112a is exposed, so that a third preliminary isolation layer structure 130 is formed in the trench 106.

When a top surface of the third preliminary isolation layer structure 130 is lower than the bottom face of the first conductive layer pattern 128, the top surface of the third preliminary isolation layer structure 130 becomes excessively close to the first dielectric layer pattern 126, and the first dielectric layer pattern 126 may be exposed in a succeeding wet etching process. Thus, as illustrated in FIG. 8, the top surface of the third preliminary isolation layer structure 130 is substantially higher than the lower portion of the first conductive layer pattern 128.

Since the sacrificial pattern 112a has an upper face that is higher than the lower face of the hard mask 104 in the preceding process for forming the sacrificial pattern 112a, the third preliminary insulation layer pattern 130 may be capable of having the upper face higher than the lower face of the first conductive layer pattern 128 and exposing the sacrificial pattern 112a.

According to some embodiments, the top surface of the third preliminary isolation layer structure 130 is coplanar with the top surface of the sacrificial pattern 112a, so that the top surface of the third preliminary isolation layer structure 130 is positioned at a sufficient distance from the first dielectric layer pattern 126.

When the second preliminary isolation layer structure 122 is removed by a dry etching process using a plasma, the plasma may cause damage to the first dielectric layer pattern 126. Thus, the second preliminary isolation layer structure 122 is advantageously and preferably removed by a wet etching process.

Figure 9:
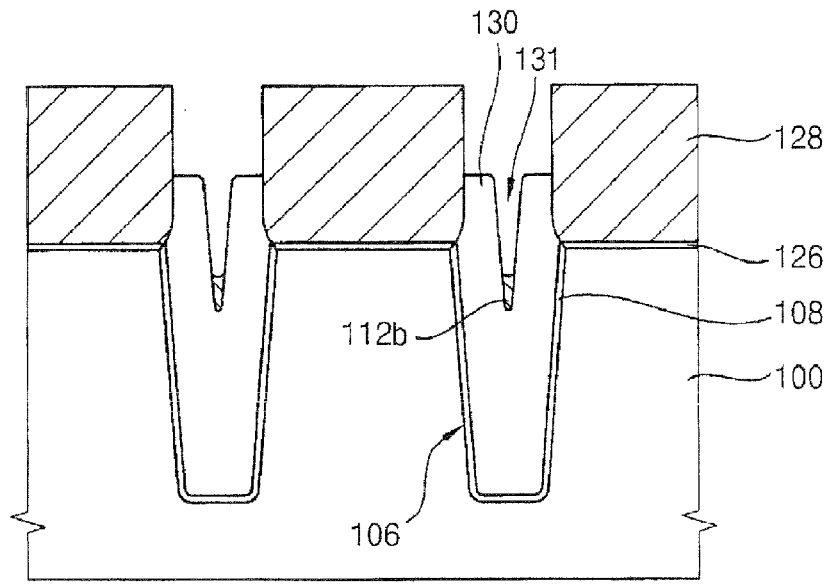

Referring to FIG. 9, the sacrificial pattern 112a is removed from the third preliminary isolation layer structure 130, so that a recessed portion 131 is formed at a central portion of the third preliminary isolation layer structure 130.

According to some embodiments, the sacrificial pattern 112a is removed by a wet etching process so that damage, which may occur to the first dielectric layer pattern 126 and may be caused by a plasma in a dry etching process, is sufficiently prevented.

According to some embodiments, the sacrificial pattern 112a needs not to be completely removed from the third preliminary isolation layer structure 130. In particular, when the recessed portion 131 is expected to be excessively deep after complete removal of the sacrificial pattern 112a, a residual sacrificial pattern 112b may remain on a bottom portion of the recessed portion 131 by variation of process conditions.

Figure 10:
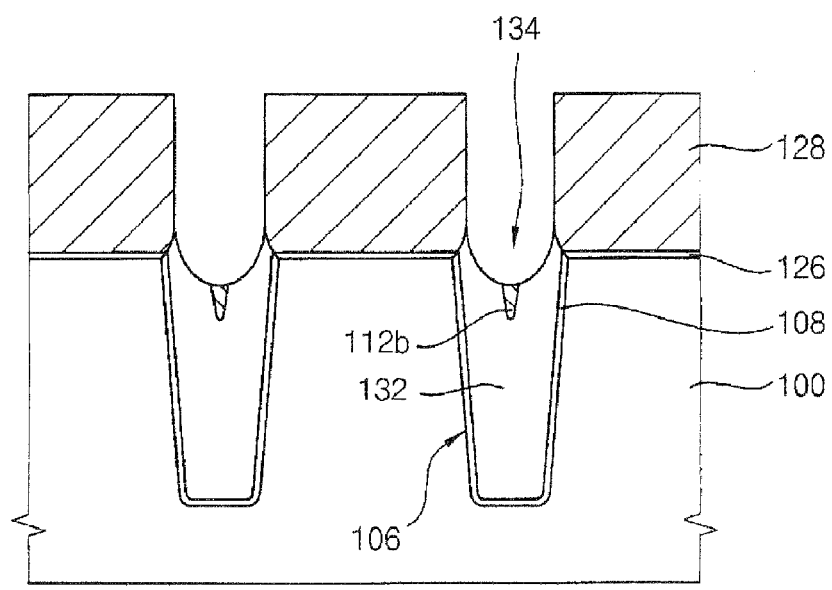

Referring to FIG. 10, the third preliminary isolation layer structure 130 is partially etched off from the substrate 100 in such a way that a sidewall of the first conductive layer pattern 128 is exposed and a sidewall of the first dielectric layer pattern 126 is still covered with the third preliminary isolation layer structure 130, thereby forming the isolation layer structure 132 having a groove 134 at a central portion thereof.

When the third preliminary isolation layer structure 130 is removed by a dry etching process using a plasma, damage may be caused to the first dielectric layer pattern 126 by the plasma. Thus, the third preliminary isolation layer structure 130 is preferably and advantageously removed by a wet etching process.

In particular, the third preliminary isolation layer structure 130 makes contact with the first conductive layer pattern 128 at an upper peripheral portion, so that the sidewall of the first conductive layer pattern 128 is further exposed to enlarge an area of the exposed sidewall of the first conductive layer pattern 128, when the third preliminary isolation layer structure 130 is partially removed from the substrate 100. A second dielectric layer 136 in FIG. 111 is to be formed on the sidewall and the top surface of the first conductive layer pattern 128 in a subsequent process, so that the more the sidewall of the first conductive layer pattern 128 is exposed, the more the surface area where the second dielectric layer 136 makes contact with the first conductive layer pattern 128 is enlarged. Accordingly, a coupling ratio of the non-volatile semiconductor device is sufficiently improved.

For the above reason, an upper portion of the third preliminary isolation layer structure needs to be removed from the substrate 100 in such a way that the sidewall of the first conductive layer pattern 128 is exposed as much as possible. However, since the second dielectric layer 136 is not easily formed on an undercut portion of the first conductive layer pattern 128, the process conditions may be adjusted in order for the isolation layer structure 132 to cover the undercut portion of the first conductive layer pattern 128.

When the third preliminary isolation layer structure 130 is partially etched to form the isolation layer structure 132, the recessed portion 131 may be transformed into the groove 134. Thus, the isolation layer structure 132 may include an upper face having a round shape.

According to some embodiments, the isolation layer structure 132 may advantageously have a central upper face that is substantially lower than an upper face of the substrate 100 corresponding to the active region. The isolation layer structure 132 has the groove 134 at the upper central portion to increase an effective area by spacing apart from first conductive layer patterns adjacent to each other. Thus, a parasite capacitance between the first conductive layer patterns may decrease and the coupling ratio may increase.

Figure 11:
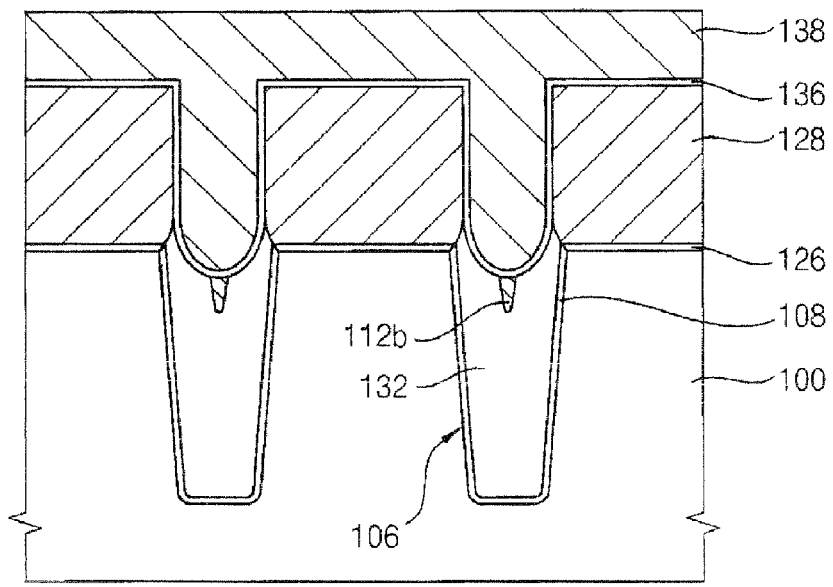

Referring to FIG. 11, the second dielectric layer 136 is formed on the top surface and the sidewall of the first conductive layer pattern 128 and on the isolation layer structure 132.

According to some embodiments, the second dielectric layer 136 may include a multilayer having an oxide/nitride/oxide (ONO) structure. According to some embodiments, the second dielectric layer 136 may be formed using a high-k material such as $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, MgO, SrO, $B_2O_3$, $SnO_2$, PbO, $PbO_2$, $Pb_3O_4$, $V_2O_3$, $La_2O_3$, $Pr_2O_3$, $Sb_2O_3$, $Sb_2O_5$, and CaO. These high-k materials may be used singly or in combination with other listed high-k materials.

A second conductive layer 138 is formed on the second dielectric layer 136 to a sufficient thickness to fill up a space enclosed by the first conductive layer pattern 128. The second conductive layer 138 may include a doped polysilicon layer or a metal suicide layer. For example, the metal silicide layer may include tungsten silicide, titanium silicide, cobalt silicide, tantalum silicide, etc.

Although not shown in the figures, the second conductive layer 138 may be patterned to thereby form a second conductive layer pattern that may serve as a control gate in the non-volatile memory device. Then, the second dielectric layer 136 and the first conductive layer pattern 128 are sequentially patterned so that both the second dielectric layer 136 and the first conductive layer pattern 128 are separated from each other at every active region of the substrate 100. The separated first conductive layer patterns are electrically isolated from each other by the isolation layer structure 132, thereby forming a floating gate electrode of the non-volatile memory device in the active region.

FIGS. 12 to 17 are cross sectional diagrams illustrating a method of manufacturing a semiconductor device in accordance with other embodiments of the invention.

Figure 12:
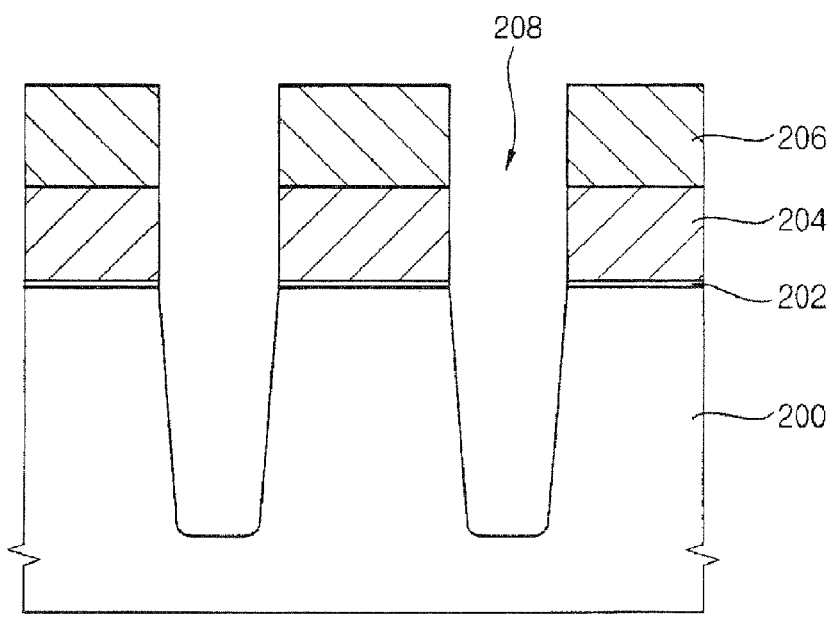
FIGS. 12 to 17 are cross sectional diagrams illustrating a method of manufacturing a semiconductor device in accordance with other embodiments of the invention.

Referring to FIG. 12, a first dielectric layer (not shown) is formed on a substrate 200. According to some embodiments, the first dielectric layer may include a silicon oxide layer that may be formed by a thermal oxidation process. According to some embodiments, the first dielectric layer may include a silicon oxide layer doped with fluorine, a silicon oxide layer doped with carbon, a low-k dielectric layer, etc.

A first conductive layer (not shown), which is to be formed into a floating gate electrode of the non-volatile semiconductor device, is formed on the first dielectric layer. The first conductive layer may be formed using doped polysilicon. In particular, a polysilicon layer may be initially formed on the first dielectric layer and then impurities may be doped into the polysilicon layer by a doping process such as an impurities diffusion process, an ion implantation process, an in situ doping process, etc.

A hard mask layer (not shown) is formed on the first conductive layer. The hard mask layer may be formed using a nitride such as silicon nitride, silicon oxynitride, etc. The hard mask layer is patterned by a photolithographic process to thereby form the hard mask 206 on the first conductive layer. The first conductive layer and the first dielectric layer are sequentially etched off from the substrate 100 using the hard mask as an etching mask to thereby form a first dielectric layer pattern 202 and a first conductive layer pattern 204 on the substrate 200.

A portion of the substrate 200, which is exposed by the hard mask 206, is etched to form an isolation trench 208 in the substrate 200. The isolation trench 208 may be formed by a self-aligned process relative to the first dielectric layer pattern 202 and the first conductive layer pattern 204. The isolation trench 208 is surrounded by the first dielectric layer pattern 202, the first conductive layer pattern 204, the hard mask 206 and an etched portion of the substrate 200.

Figure 13:
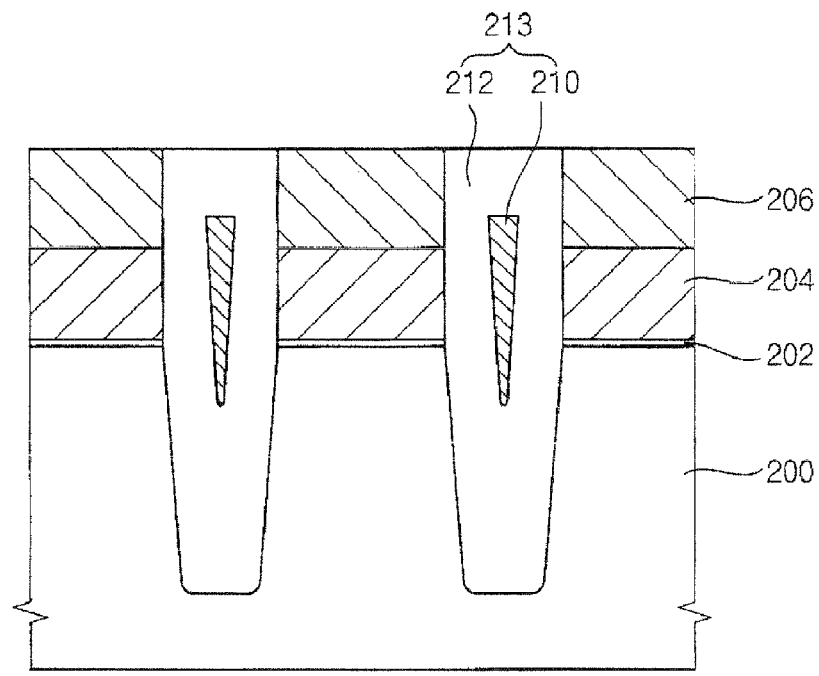

Referring to FIG. 13, the same processing steps as described with reference to FIGS. 1 and 2 are performed at first. Briefly describing the above process steps, a buffer oxide layer (not shown) is formed on an inner wall of the isolation trench 208, and then a first insulation layer (not shown) is formed on the buffer oxide layer, so that the isolation trench 208 is partially filled with the first insulation layer including a gap corresponding to the isolation trench 208. The gap of the first insulation layer is filled with a sacrificial layer (not shown).

Then, the sacrificial layer is partially removed from the gap of the first insulation layer to thereby form a sacrificial pattern 210 on a bottom portion of the gap.

When a top surface of the sacrificial pattern 210 is lower than a bottom portion of the first conductive layer pattern 204, it is difficult for a top surface of an isolation layer structure to take a concave shape with respect to a top surface of the substrate 200 in a subsequent process. Consequently, according to some embodiments the top surface of the sacrificial pattern 210 is preferably substantially higher than one fourth (¼) of the height of the first conductive layer pattern 204.

Furthermore, a top surface of the sacrificial pattern 210 is lower than a top surface of the hard mask 206, so that the top surface of the sacrificial pattern 210 is prevented from being exposed in a subsequent polishing process. There is much possibility that an upper portion of the hard mask 206 is removed from the substrate 200 in the subsequent polishing process, so that the top surface of the sacrificial pattern 210 may be positioned in a range substantially lower than three-fourths of a height of the hard mask 206. As a result, there is little chance that the top surface of the sacrificial pattern 210 is exposed even though the upper portion of the hard mask 206 is excessively removed from the substrate 200 in the polishing process.

A second insulation layer (not shown) is formed on the first insulation layer to a sufficient thickness to fill up a residual gap of the first insulation layer, so that the isolation trench 208 is sufficiently filled with the buffer oxide layer, the first insulation layer, the sacrificial pattern 210 and the second insulation layer. The second and the first insulation layers are polished from the substrate 200 by a CMP process until the top surface of the hard mask 206 is exposed, so that the first and second insulation layers only remain in the isolation trench 208 to thereby form an insulation layer pattern 212 in the isolation trench 208. The sacrificial pattern 210 in the insulation layer pattern 212 has an etching rate different from the insulation layer pattern 212. In the same way as described above, a structure including the insulation layer pattern 212 and the sacrificial pattern 210 is referred to as a first preliminary isolation layer structure 213.

Figure 14:
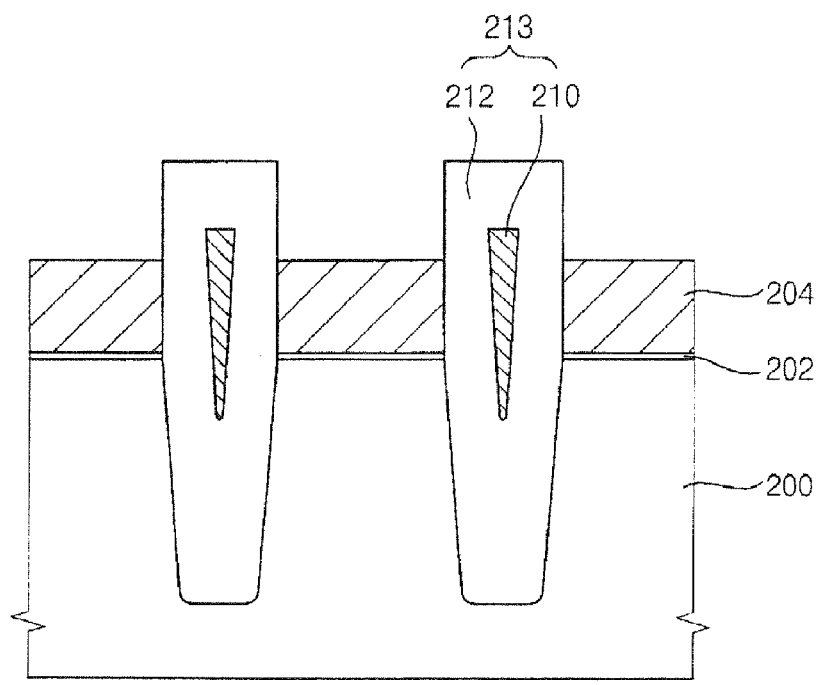

Referring to FIG. 14, the hard mask 206 is removed from the first conductive layer pattern 204 by an etching process. The sacrificial pattern 210 is positioned at an inside of the insulation layer pattern 212, so that the sacrificial pattern 210 is prevented from being removed in the above etching process for removing the hard mask 206.

A photoresist pattern (not shown) is formed on the substrate 200 in such a way that a cell region of the substrate 200 is exposed through the photoresist pattern and a peripheral region of the substrate 200 is covered with the photoresist pattern, so that the first preliminary isolation layer structure 213 on the cell region is partially etched away in a subsequent etching process against the first preliminary isolation layer structure 213 while the first preliminary isolation layer structure 213 on the peripheral region remains unetched in the subsequent etching process.

Figure 15:
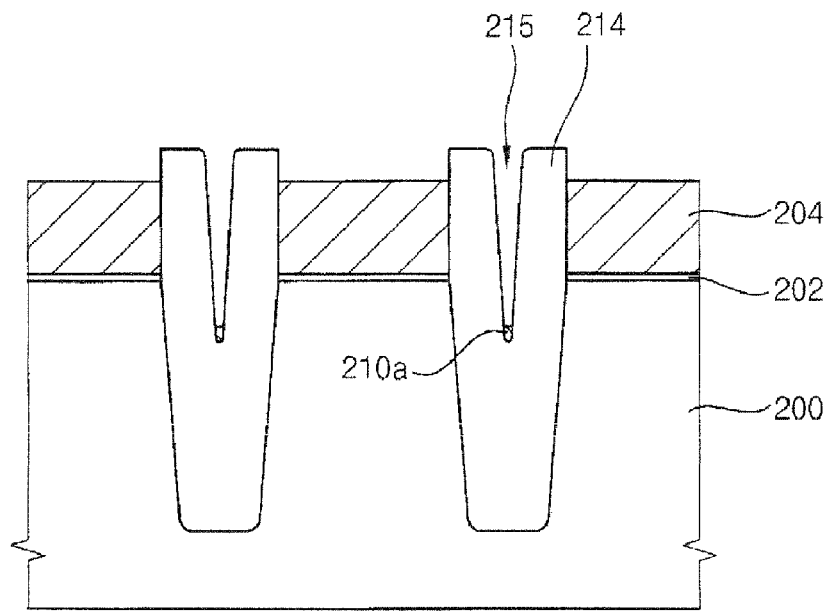

Referring to FIG. 15, processing steps very similar to those as described with reference to FIGS. 8 and 9 are carried out at first. In the above process steps, the insulation layer pattern 212 is partially etched off from the substrate 200 until the top surface of the sacrificial pattern 210 is exposed, so that a second preliminary isolation layer structure 214 is formed in the isolation trench 208. The sacrificial pattern 210 is partially removed from the second preliminary isolation layer structure 214, so that a recessed portion 215 is formed at a central portion of the second preliminary isolation layer structure 214. The sacrificial pattern 210 needs not to be completely removed from the second preliminary isolation layer structure 214. In particular, when the recessed portion 215 is expected to be excessively deep after complete removal of the sacrificial pattern 210, a residual sacrificial pattern 210a may remain at a bottom portion of the recessed portion 215 by variation of process conditions.

Figure 16:
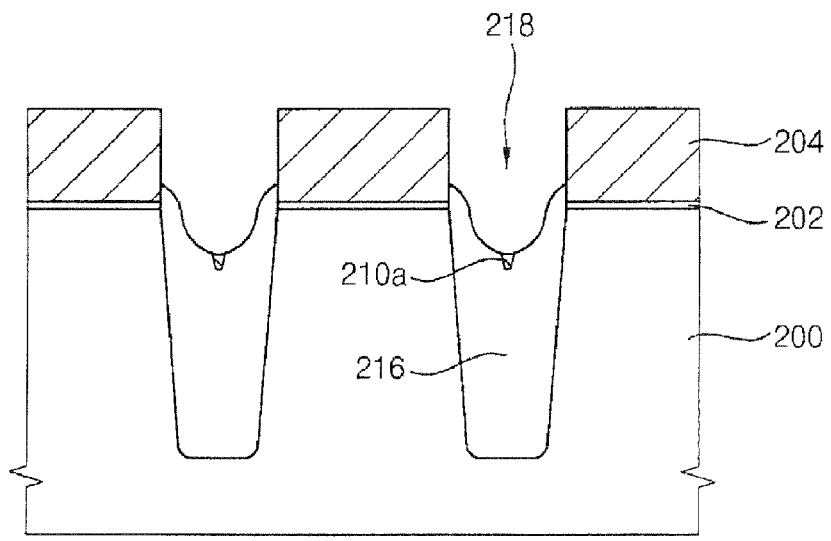

Referring to FIG. 16, the second preliminary isolation layer structure 214 is partially etched off from the substrate 200 in such a way that a sidewall of the first conductive layer pattern 204 is exposed while a sidewall of the first dielectric layer pattern 202 is still covered with the second device isolation layer structure 214, to thereby form an isolation layer structure 216 having a groove 218 at a central portion thereof.

According to some embodiments, the upper portion of the second preliminary isolation layer structure 214 is etched off from the substrate 200 under such conditions that the top surface of the second preliminary isolation layer pattern 214 is concave with respect to a top surface of the substrate 200 in the active region, so that an effective area by spacing apart from first conductive layer patterns adjacent to each other may increase. Thus, a parasitic capacitance between the first conductive layer patterns may decrease and the coupling ratio may increase.

Figure 17:
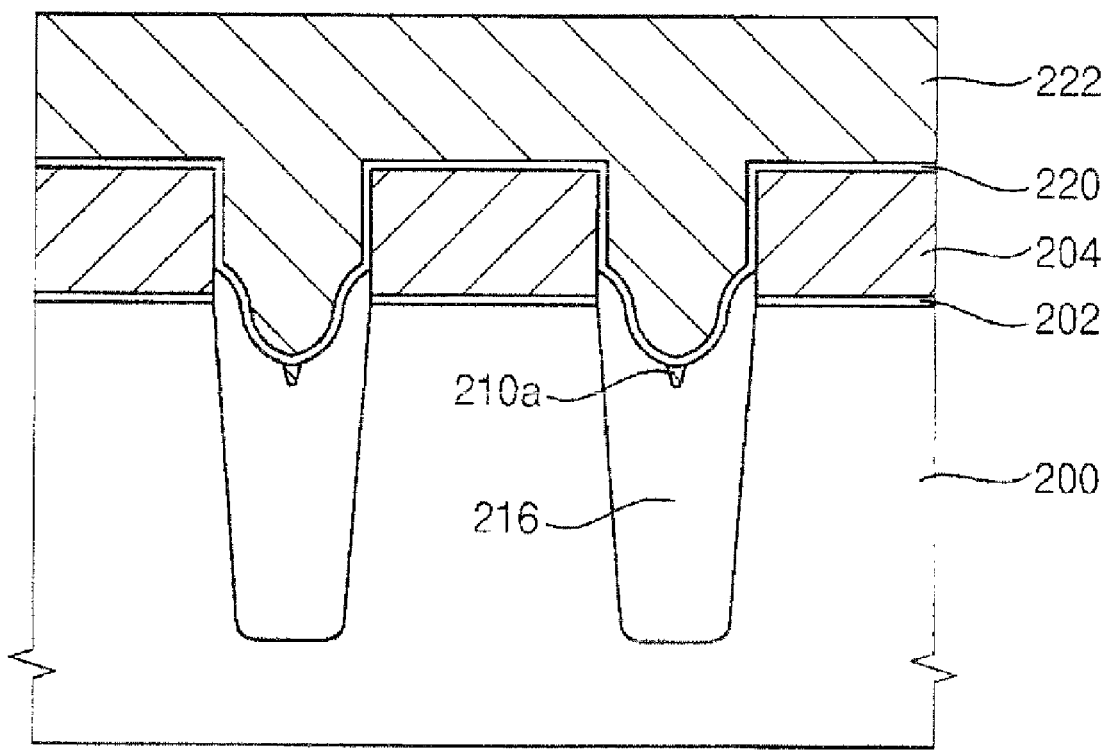

Referring to FIG. 17, the second dielectric layer 220 is formed on the top surface and the sidewall of the first conductive layer pattern 204 and on the isolation layer structure 216. A second conductive layer 222 is formed on the second dielectric layer 220 to a sufficient thickness to fill up a space defined by the conductive layer pattern 204 and the groove 218 of the device isolation layer structure 216. The second conductive layer may be formed using doped polysilicon or a metal silicide. The metal silicide may include tungsten silicide, titanium silicide, cobalt silicide, tanthalum silicide, etc.

According to some embodiments, the second conductive layer 222 may be easily formed in the groove 218 of the isolation layer structure 216, due to a rounded area in the groove 218.

Although not shown in the figures, the second conductive layer 222 may be patterned to thereby form a second conductive layer pattern that may serve as a control gate in the non-volatile memory device. Then, the second dielectric layer 220 and the first conductive layer pattern 204 are sequentially patterned so that both the second dielectric layer 220 and the first conductive layer pattern 204 are separated from each other at every active region of the substrate 200. The separated first conductive layer patterns are electrically isolated from each other by the isolation layer structure 216, thereby forming a floating gate electrode of the non-volatile memory device in the active region.

According to embodiments of the invention, an isolation layer structure covers a sidewall of a first dielectric layer, so that an effective surface area where a second dielectric layer makes contact with a first conductive layer pattern is sufficiently enlarged, thereby improving a coupling ratio of a non-volatile semiconductor device. Furthermore, the isolation layer structure having a groove at a top surface thereof with respect to a top surface of a substrate is formed by a wet etching process, so that damage to a first dielectric layer by a plasma is sufficiently prevented during the formation of the isolation layer structure, thereby sufficiently improving reliability of the non-volatile semiconductor device.

The invention may be practiced in many ways. What follows are exemplary, non-limiting descriptions of some embodiments of the invention.

According to some embodiments, a method of manufacturing an insulation layer structure includes forming a first structure including an insulation layer pattern having a sacrificial pattern on the substrate, the sacrificial pattern having an etching rate that is different from the insulation layer pattern. The method includes forming a second structure by partially removing the insulation layer pattern until the sacrificial pattern is exposed. The method includes forming a third structure having a recessed portion at a central portion thereof by at least partially removing the sacrificial pattern from the insulation layer pattern and then an upper portion of the third structure may be removed, so that a top surface of the third structure is concave with respect to a top surface of the substrate.

According to some embodiments, the first structure is formed by forming a trench in the substrate, forming a first insulation layer on a sidewall and a bottom face of the trench, so that the first insulation layer includes a gap corresponding to the trench, forming the sacrificial pattern at a lower portion of the gap of the first insulation layer, forming a second insulation layer on the first insulation layer to a sufficient thickness to fill up an upper portion of the gap of the first insulation layer, and sequentially polishing the second and first insulation layers such that only the first and second insulation layers remain in the trench, thereby forming the insulation layer pattern having the first and second insulation layers in the trench.

According to some embodiments, the upper portion of the third structure may be removed by a wet etching process.

According to some embodiments, a method of manufacturing a semiconductor device includes forming a first structure that protrudes from a substrate, where the first structure including an insulation layer pattern having a sacrificial pattern therein and the sacrificial pattern has an etching rate that is different from the insulation layer pattern. An opening defined by the first structure may be formed, wherein an active region of the substrate in which conductive structures are formed is exposed through the opening. A first dielectric layer pattern is formed on the substrate in the active region. A first conductive layer pattern may be formed on the first dielectric layer pattern in the active region, so that the opening is filled with the first conductive layer pattern. A second structure may be formed by partially removing the insulation layer pattern until the sacrificial pattern is exposed. A third structure having a recessed portion at a central portion thereof may be formed by at least partially removing the sacrificial pattern from the insulation layer pattern. An isolation layer structure, a top surface of which is concave with respect to a top surface of the substrate, may be formed by removing an upper portion of the third structure, such that a sidewall of the first conductive pattern is exposed and a sidewall of the first dielectric pattern is still covered with the insulation layer pattern.

According to some embodiments, the insulation layer pattern may include silicon oxide.

According to some embodiments, the sacrificial pattern may include silicon nitride, boron nitride, or silicon germanium.

According to some embodiments, the first structure may be formed by forming a hard mask pattern on the substrate, the hard mask exposing a region of the substrate in which the first structure is to be formed, forming a trench on the substrate by etching the substrate using the hard mask pattern as an etching mask, forming a first insulation layer on a sidewall and a top surface of the hard mask pattern and a surface of the substrate in the trench, such that the first insulation layer includes a gap corresponding to the trench, forming the sacrificial pattern at a lower portion of the gap of the first insulation layer, forming a second insulation layer on the first insulation layer to a sufficient thickness to fill up an upper portion of the first insulation layer, and sequentially polishing the second and first insulation layers until a top surface of the hard mask pattern is exposed.

According to some embodiments, the sacrificial pattern may be formed by forming a sacrificial layer on the first insulation layer to a sufficient thickness to fill up the gap of the first insulation layer, and partially removing the sacrificial layer from the first insulation layer, so that the sacrificial layer only remains at the lower portion of the gap of the first insulation layer.

According to some embodiments, the sacrificial layer may be partially removed by a wet etching process or a dry etching process.

According to some embodiments, a top surface of the sacrificial pattern is lower than a top surface of the hard mask pattern and is higher than a bottom surface of the hard mask pattern.

According to some embodiments, a top surface of the second structure is substantially higher than a lower portion of the first conductive layer pattern.

According to some embodiments, a sidewall of the first structure may be partially removed while the opening is formed, so that a lower diameter of the opening is smaller than an upper diameter of the opening.

According to some embodiments, the sacrificial pattern may be partially removed by a wet etching process.

According to some embodiments, the upper portion of the third structure may be removed by a wet etching process.

According to some embodiments, after forming the device isolation layer structure, a second dielectric layer may be further formed on a sidewall and a top surface of the first conductive layer pattern and the concave top surface of the isolation layer structure. A second conductive layer pattern may be then formed on the second dielectric layer to a sufficient thickness to fill up a space defined by the second conductive layer pattern and the concave top surface of the isolation layer structure.

According to some embodiments, a method of manufacturing a semiconductor device includes forming a pattern structure that includes a first dielectric layer pattern, a first conductive layer pattern, and a hard mask pattern that are sequentially stacked on a substrate. A trench may be formed on the substrate by etching the substrate using the hard mask pattern as an etching mask. A first structure that includes an insulation layer pattern having a sacrificial pattern therein and the sacrificial pattern having an etching rate that is different from the insulation layer pattern may be formed. A second structure may be formed by partially removing the insulation layer pattern until the sacrificial pattern is exposed. A third structure having a recessed portion at a central portion thereof may be formed by at least partially removing the sacrificial pattern from the insulation layer pattern. An isolation layer structure having a top surface that is concave with respect to a top surface of the substrate may be formed by removing an upper portion of the third structure, such that a sidewall of the first conductive pattern is exposed and a sidewall of the first dielectric pattern is still covered with the insulation layer pattern.

According to some embodiments, the first structure may include silicon oxide. According to some embodiments, the sacrificial pattern may include silicon nitride, boron nitride and silicon germanium.

According to some embodiments, the first structure may be formed by forming a first insulation layer on a sidewall and a bottom surface of the trench and on a top surface of the pattern structure, so that the first insulation layer includes a gap corresponding to the trench, forming the sacrificial pattern at a lower portion of the gap of the first insulation layer, forming a second insulation layer on the first insulation layer to a sufficient thickness to fill up an upper portion of the gap of the first insulation layer, and sequentially polishing the second and first insulation layers such that the first and second insulation layers only remain in the trench, thereby forming the insulation layer pattern having the first and second insulation layers in the trench.

According to some embodiments, the sacrificial pattern may be at least partially removed by a wet etching process. According to some embodiments, the upper portion of the third structure may be removed by a wet etching process.

According to some embodiments, after forming the device isolation layer structure, a second dielectric layer may be further formed on a sidewall and a top surface of the first conductive layer pattern and the concave top surface of the isolation layer structure and a second conductive layer pattern may be further formed on the second dielectric layer to a sufficient thickness to fill up a space defined by the second conductive layer pattern and the concave top surface of the isolation layer structure.

According to some embodiments, an isolation layer structure covers a sidewall of a first dielectric layer, so that an effective surface area where a second dielectric layer makes contact with a first conductive layer pattern is sufficiently enlarged, thereby improving a coupling ratio of a non-volatile semiconductor device. Furthermore, the isolation layer structure having a groove at a top surface thereof with respect to a top surface of a substrate is formed by a wet etching process, so that damage to a first dielectric layer by a plasma is sufficiently prevented during the formation of the isolation layer structure, thereby sufficiently improving reliability of the non-volatile semiconductor device.

In a method of forming an isolation layer structure according to some embodiments, after a first structure, including an insulation layer pattern having a sacrificial pattern and an etching rate different from the insulation layer pattern, is formed on a substrate, a second structure is formed, exposing the sacrificial pattern by partially etching the insulation layer pattern. A third structure having a recessed portion at a central portion is formed by at least partially etching the sacrificial pattern. An upper portion of the third structure is removed so that a top surface of the third structure is concave with respect to a top surface of the substrate.

The embodiments described above are illustrative of the invention and are not to be construed as limiting thereof. Although a few example embodiments of the invention have been described, those skilled in the art will readily appreciate that many modifications may be made to the exemplary embodiments without materially departing from one or more of the inventive aspects found in those embodiments. Accordingly, all such modifications are intended to be included within the scope of the invention as defined by the attached claims.

In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A method of forming an isolation layer structure for a semiconductor device, the method comprising:
   forming a first structure on a substrate, the first structure including an insulation layer pattern and a sacrificial pattern that is enclosed and surrounded by the insulation layer pattern, the sacrificial pattern having an etching rate that is different from the insulation layer pattern;
   partially removing the insulation layer pattern until the sacrificial pattern is exposed to form a second structure;
   partially removing the sacrificial pattern from the insulation layer pattern to form a third structure having a recessed portion at a central portion thereof; and
   removing an upper portion of the third structure such that a top surface of the third structure is concave with respect to a top surface of the substrate.

2. The method of claim 1, wherein forming the first structure comprises:
   forming a trench in which the first structure is to be formed on the substrate;
   forming a first insulation layer on a sidewall and a bottom face of the trench, so that the first insulation layer includes a gap corresponding to the trench;
   forming the sacrificial pattern at a lower portion of the gap of the first insulation layer;
   forming a second insulation layer on the first insulation layer to a sufficient thickness to fill up an upper portion of the gap of the first insulation layer; and
   sequentially polishing the second and first insulation layers such that the first and second insulation layers only remain in the trench, thereby forming the insulation layer pattern having the first and second insulation layers in the trench.

3. The method of claim 1, wherein removing the upper portion of the third structure comprises wet etching.

4. A method of manufacturing a semiconductor device, the method comprising:
   forming a first structure that protrudes from a substrate, the first structure including an insulation layer pattern and a sacrificial pattern that is enclosed and surrounded by the insulation layer pattern, the sacrificial pattern having an etching rate that is different from the insulation layer pattern;
   forming an opening that is defined by the first structure, the opening exposing an active region of the substrate where conductive structures will be formed;
   forming a first dielectric layer pattern on the active region of the substrate;
   forming a first conductive layer pattern on the first dielectric layer pattern in the active region, so that the opening is filled with the first conductive layer pattern;
   partially removing the insulation layer pattern until the sacrificial pattern is exposed to form a second structure;
   partially removing the sacrificial pattern from the insulation layer pattern to form a third structure having a recessed portion at a central portion thereof; and removing an upper portion of the third structure to form an isolation layer structure having a top surface that is concave with respect to a top surface of the substrate, that exposes a sidewall of the first conductive pattern, and that covers a sidewall of the first dielectric pattern with the insulation layer pattern.

5. The method of claim 4, the insulation layer pattern comprising silicon oxide.

6. The method of claim 5, the sacrificial pattern comprising one selected from the group consisting of silicon nitride, boron nitride, and silicon germanium.

7. The method of claim 4, wherein forming the first structure comprises:
    forming a hard mask pattern on the substrate, the hard mask exposing a region of the substrate;
    etching the substrate using the hard mask pattern as an etching mask to form a trench;
    forming a first insulation layer that is disposed on a top surface of the hard mask pattern, on a sidewall of the hard mask pattern, and on a surface of the substrate in the trench, the first insulation layer including a gap corresponding to the trench;
    forming the sacrificial pattern within a lower portion of the gap;
    filling the gap with a second insulation layer that is disposed on the first insulation layer; and
    polishing the second and first insulation layers until a top surface of the hard mask pattern is exposed.

8. The method of claim 7, wherein forming the sacrificial pattern comprises:
    forming a sacrificial layer on the first insulation layer to a sufficient thickness to fill up the gap of the first insulation layer; and
    partially removing the sacrificial layer from the first insulation layer, so that the sacrificial layer only remains at the lower portion of the gap of the first insulation layer.

9. The method of claim 8, wherein partially removing the sacrificial layer comprises wet etching.

10. The method of claim 8, wherein partially removing the sacrificial layer comprises dry etching.

11. The method of claim 8, wherein a top surface of the sacrificial pattern is disposed lower than a top surface of the hard mask pattern and is disposed higher than a bottom surface of the hard mask pattern.

12. The method of claim 4, wherein a top surface of the second structure is substantially higher than a lower portion of the first conductive layer pattern.

13. The method of claim 4, wherein a sidewall of the first structure is partially removed while the opening is formed, so that a lower diameter of the opening is smaller than an upper diameter of the opening.

14. The method of claim 4, wherein partially removing the sacrificial pattern comprises wet etching.

15. The method of claim 4, wherein removing the upper portion of the third structure comprises wet etching.

16. The method of claim 4, after forming the device isolation layer structure, further comprising:
    forming a second dielectric layer on a sidewall and a top surface of the first conductive layer pattern and the concave top surface of the isolation layer structure; and
    forming a second conductive layer pattern on the second dielectric layer to a sufficient thickness to fill up a space defined by the second dielectric layer and the concave top surface of the isolation layer structure.

17. The method of claim 4, wherein forming the third structure comprises partially covering a sidewall of the first conductive layer pattern with the insulation layer pattern.

18. A method of manufacturing a semiconductor device, the method comprising:
    forming a pattern structure on a substrate, the pattern structure including a first dielectric layer pattern, a first conductive layer pattern and a hard mask pattern sequentially stacked on the substrate;
    forming a trench in the substrate by etching the substrate using the hard mask pattern as an etching mask;
    forming a first structure in the trench, the first structure entirely disposed in a region between sidewalls of the trench, the first structure including an insulation layer pattern and a sacrificial pattern that is enclosed and surrounded by the insulation layer pattern, the sacrificial pattern having an etching rate that is different from the insulation layer pattern;
    partially removing the insulation layer pattern until the sacrificial pattern is exposed to form a second structure;
    partially removing the sacrificial pattern from the insulation layer pattern to form a third structure having a recessed portion at a central portion thereof; and
    forming a device isolation layer structure, of which a top surface is concave with respect to a top surface of the substrate, by removing an upper portion of the third structure, such that a sidewall of the first conductive pattern is exposed and a sidewall of the first dielectric pattern is still covered with the insulation layer pattern.

19. The method of claim 18, the first structure comprising silicon oxide.

20. The method of claim 19, the sacrificial pattern comprising one selected from the group consisting of silicon nitride, boron nitride, and silicon germanium.

21. The method of claim 18, wherein forming the first structure comprises:
    forming a first insulation layer on a sidewall and a bottom surface of the trench and on a top surface of the pattern structure, so that the first insulation layer includes a gap corresponding to the trench;
    forming the sacrificial pattern at a lower portion of the gap of the first insulation layer;
    forming a second insulation layer on the first insulation layer to a sufficient thickness to fill up an upper portion of the gap of the first insulation layer; and
    sequentially polishing the second and first insulation layers such that the first and second insulation layers only remain in the trench, thereby forming the insulation layer pattern having the first and second insulation layers in the trench.

22. The method of claim 18, wherein partially removing the sacrificial pattern comprises wet etching.

23. The method of claim 18, wherein removing the upper portion of the third structure is performed by a wet etching process.

24. The method of claim 18, after forming the device isolation layer structure, further comprising:
    forming a second dielectric layer on a sidewall and a top surface of the first conductive layer pattern and the concave top surface of the isolation layer structure; and
    forming a second conductive layer pattern on the second dielectric layer to a sufficient thickness to fill up a space defined by the second dielectric layer and the concave top surface of the isolation layer structure.

25. The method of claim 18, in which forming the first structure comprises forming the first structure such that an upper surface of the first structure is disposed above an upper surface of the substrate.

* * * * *

UNITED STATES PATENT AND TRADEMARK OFFICE
CERTIFICATE OF CORRECTION

PATENT NO. : 7,498,233 B2
APPLICATION NO. : 11/381065
DATED : March 3, 2009
INVENTOR(S) : Min Kim et al.

It is certified that error appears in the above-identified patent and that said Letters Patent is hereby corrected as shown below:

Column 9, line 44, the word "FIG. 111" should read --FIG. 11--;
Column 10, line 26, the word "suicide" should read --silicide--.

Signed and Sealed this

Thirteenth Day of July, 2010

David J. Kappos
*Director of the United States Patent and Trademark Office*